US010723659B2

United States Patent
Shi et al.

(10) Patent No.: US 10,723,659 B2
(45) Date of Patent: Jul. 28, 2020

(54) DENSITY GRADIENT IN BLADE TO REDUCE CENTRIFUGAL LOAD

(71) Applicants: Rolls-Royce Corporation, Indianapolis, IN (US); Rolls-Royce High Temperature Composites Inc., Cypress, CA (US)

(72) Inventors: Jun Shi, Carmel, IN (US); Sungbo Shim, Irvine, CA (US)

(73) Assignees: ROLLS-ROYCE HIGH TEMPERATURE COMPOSITES INC., Cypress, CA (US); ROLLS-ROYCE CORPORATION, Indianapolis, IN (US)

( * ) Notice: Subject to any disclaimer, the term of this patent is extended or adjusted under 35 U.S.C. 154(b) by 82 days.

(21) Appl. No.: 16/017,457

(22) Filed: Jun. 25, 2018

(65) Prior Publication Data
US 2019/0389777 A1    Dec. 26, 2019

(51) Int. Cl.
  *F01D 5/14*    (2006.01)
  *C04B 35/80*   (2006.01)
  *C04B 35/628*  (2006.01)
  *C04B 35/657*  (2006.01)
  *F01D 5/28*    (2006.01)

(52) U.S. Cl.
  CPC ........ *C04B 35/80* (2013.01); *C04B 35/62847* (2013.01); *C04B 35/62884* (2013.01); *C04B 35/62886* (2013.01); *C04B 35/62894* (2013.01); *C04B 35/657* (2013.01); *F01D 5/147* (2013.01); *F01D 5/282* (2013.01); *C04B 2235/3826* (2013.01); *C04B 2235/48* (2013.01); *C04B 2235/775* (2013.01); *F05D 2220/32* (2013.01); *F05D 2230/20* (2013.01); *F05D 2240/30* (2013.01); *F05D 2260/941* (2013.01); *F05D 2300/2261* (2013.01); *F05D 2300/603* (2013.01)

(58) Field of Classification Search
  CPC .... F01D 5/147; F01D 5/282; F05D 2260/941; C04B 2232/3826; C04B 2232/5244; C04B 2235/775
  See application file for complete search history.

(56) References Cited

U.S. PATENT DOCUMENTS

| 6,280,550 | B1 * | 8/2001 | Steibel | B32B 18/00 156/182 |
| 7,247,212 | B2 * | 7/2007 | Kostar | B28B 19/00 156/148 |
| 2006/0081323 | A1 | 4/2006 | Millard et al. | |
| 2014/0272377 | A1 * | 9/2014 | Chamberlain | F01D 25/005 428/312.6 |
| 2016/0175960 | A1 * | 6/2016 | Harris | C04B 35/117 219/72 |

OTHER PUBLICATIONS

Chemical Vapor Infiltration, dated Jan. 8, 2018, pp. 1-4, published online by Wikipedia.

(Continued)

*Primary Examiner* — Ninh H. Nguyen
(74) *Attorney, Agent, or Firm* — Brinks Gilson & Lione

(57) ABSTRACT

A blade for a gas turbine engine, and methods of manufacture of such a blade having a continuous density gradient so that the portion of the blade nearest the rotator shaft is of a higher density than the portion of the blade furthest from the rotator shaft.

19 Claims, 5 Drawing Sheets

(56) References Cited

OTHER PUBLICATIONS

Miklós Gerendás et al., Improvement of Oxide/Oxide CMC and Development of Combustor and Turbine Components in the HIPOC Program, ASME 2011 Turbo Expo: Turbine Technical Conference and Exposition, vol. 1, dated 2011, pp. 1-14 (477-490), published by ASME and Rolls-Royce Deutschland Ltd & Co KG, Vancouver, Canada.

* cited by examiner

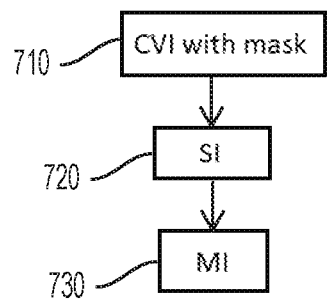
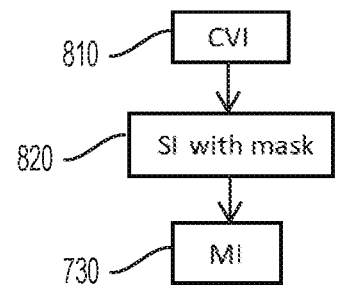
FIG. 7          FIG. 8
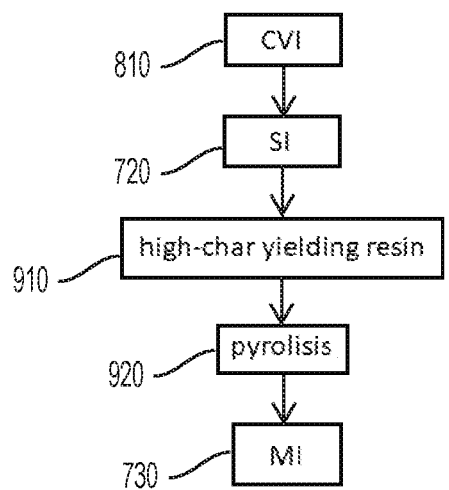
FIG. 9

DENSITY GRADIENT IN BLADE TO REDUCE CENTRIFUGAL LOAD

TECHNICAL FIELD

The present disclosure relates to a blade for a gas turbine engine, and methods of manufacture of such a blade.

BACKGROUND

Turbine blades and compressor blades in a gas turbine engine may be made of metal alloys, ceramic matrix composites (CMCs), or any other suitable materials. Present blades for gas turbine engines suffer from a variety of drawbacks limitations and disadvantages.

BRIEF DESCRIPTION OF THE DRAWINGS

The examples may be better understood with reference to the following drawings and description. The components in the figures are not necessarily to scale. Moreover, in the figures, like-referenced numerals designate corresponding parts throughout the different views.

FIG. 7 illustrates a flowchart detailing an example of a method of forming a blade with a density gradient;

FIG. 8 illustrates a flowchart detailing an example of a method of forming a blade with a density gradient; and FIG. 9 illustrates a flowchart detailing an example of a method of forming a blade with a density gradient.

DETAILED DESCRIPTION

By way of an introductory example, a contiguous blade for a turbine engine with a density gradient in the blade such that the blade includes a decrease in density from a root-end of the blade, where the blade attaches to the disc and experiences the most stress, to a tip-end of the blade. One example of such a blade is a ceramic matrix composite (CMC) turbine blade with a predominantly silicon carbide root-end and a high silicon content tip, wherein the material at the blade tip comprises at least 50 percent silicon by weight.

One advantage of the systems and methods described below may be a reduction in mechanical stress resulting from a centrifugal load on a blade for a gas turbine engine. Modem gas turbine engines operate at high pressure and temperature, which leads to higher material temperature. The higher material temperature necessitates the use of more heat-resistant material, such as ceramic matrix composites (CMCs), for components including, for example: combustion liners; turbine blades in single stages or multi-stages; and turbine nozzles provided in correspondence to the turbine blades. Additionally, such blades experience a higher radial stress at the blade root, where, for example, the blades attach to a hub.

Generally, higher density material may correspond to higher strength material when compared to the same material at a lower density. Having a reduced mass at the tip of the blade opposite the root may decrease the force on the root, thus decreasing the stress on the root.

Alternatively or in addition, an interesting feature of the systems and methods described below may be a decrease in the overall effective mass of the blade while maintaining durability, thus increasing the efficiency of the gas turbine engine.

Figure 1:
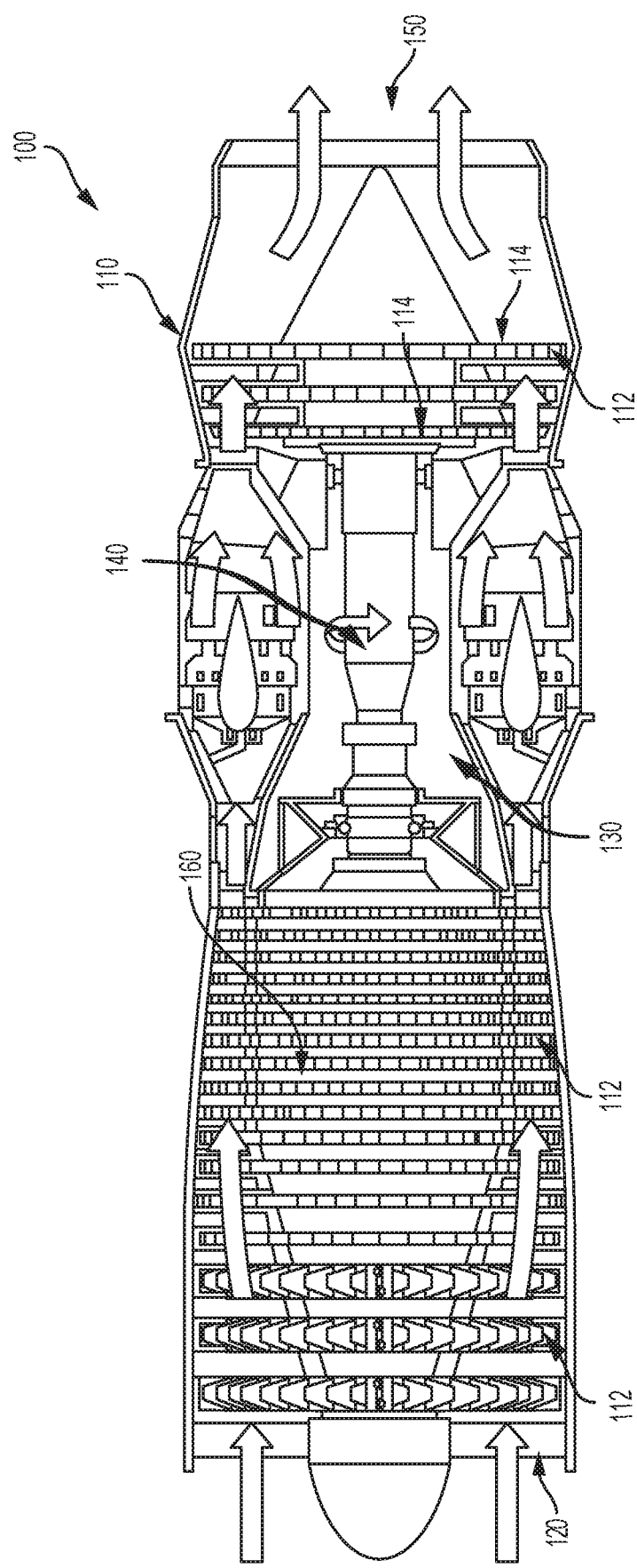
FIG. 1 illustrates a cross-sectional view of an example of a gas turbine engine.

FIG. 1 is a cross-sectional view of a gas turbine engine 100. In some examples, the gas turbine engine 100 may supply power to and/or provide propulsion of an aircraft. Examples of the aircraft may include a helicopter, an airplane, an unmanned space vehicle, a fixed wing vehicle, a variable wing vehicle, a rotary wing vehicle, an unmanned combat aerial vehicle, a tailless aircraft, a hover craft, and any other airborne and/or extraterrestrial (spacecraft) vehicle. Alternatively or in addition, the gas turbine engine 100 may be utilized in a configuration unrelated to an aircraft such as, for example, an industrial application, an energy application, a power plant, a pumping set, a marine application (for example, for naval propulsion), a weapon system, a security system, a perimeter defense or security system.

The gas turbine engine 100 may take a variety of forms in various examples. Although depicted as an axial flow engine, in some forms the gas turbine engine 100 may have multiple spools and/or may be a centrifugal or mixed centrifugal/axial flow engine. In some forms, the gas turbine engine 100 may be a turboprop, a turbofan, or a turboshaft engine. Furthermore, the gas turbine engine 100 may be an adaptive cycle and/or variable cycle engine. Other variations are also contemplated.

The gas turbine engine 100 may include a turbine section 110, a turbine 114, a turbine blade 112, an intake section 120, a combustion section 130, a shaft 140, an exhaust section 150, a compressor section 160, and a compressor blade 162. During operation of the gas turbine engine 100, fluid received from the intake section 120, such as air, may be compressed within the compressor section 160. The compressed fluid may then be mixed with fuel and the mixture may be burned in the combustion section 130. The combustion section 130 may include any suitable fuel injection and combustion mechanisms. The hot, high pressure fluid may then pass through the turbine section 110 to extract energy from the fluid and cause a turbine shaft of a turbine 140 in the turbine section 110 to rotate, which in turn drives the compressor section 160. Discharge fluid may exit the exhaust section 150.

As noted above, the hot, high pressure fluid passes through the turbine section 110 during operation of the gas turbine engine 100. As the fluid flows through the turbine section 110, the fluid passes between adjacent turbine blades 112 of the turbine 114 causing the turbine 114 to rotate. The rotating turbine 114 may turn the shaft 140, for example. The blades 112 may rotate around an axis of rotation, which may correspond to a centerline X of the turbine 114 in some examples.

Figure 2:
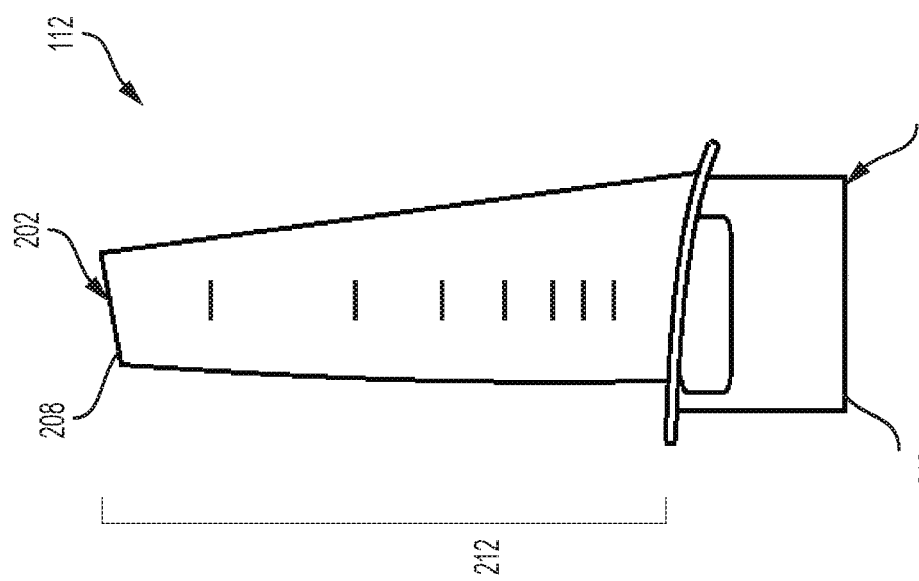
FIG. 2 illustrates a cross-section of finished blade with a density gradient.

FIG. 2 is a cross-sectional view of the turbine blade 112 having a root-end 200 and a tip-end 202 opposite the root-end 200. The root-end 200 may be located where the blade couples to a disc (not shown), which in turn may couple to the shaft 140. In other words, if the blade 112 is arranged to rotate about the shaft 140, the tip-end 202 is located on a radially outward end of the blade 112, and the root-end 200 is located on a radially inward end of the blade 112. The blade 112 may have a density gradient 212, which is a change in density over an entire length of the blade 112 or over one or more portions thereof. The rate of change in the density may vary and/or be constant along the density gradient 212. The density gradient 212 is represented in FIG. 2 as a series of horizontal lines unequally spaced apart, where a distance between two adjacent horizontal lines indicates the respective density of the blade 112 in an area of the blade where the two adjacent horizontal lines are located. In FIG. 2, the closer together that adjacent horizontal lines are, the higher the density. The change in density may be measured in units of density divided by units of length. Density, in the context of the density gradient 212, is not determined by porosity, where porosity is defined as a void fraction and is an indication of a fraction of a material that is empty space. Generally, porosity is expressed as a fraction of the volume of voids over the total volume, typically written as a number between 0 and 1, or as a percentage between 0% and 100%. In one example of the density gradient 212, the root-end 200 of the blade 112 may comprise a first material, and the tip-end 202 may comprise a second material, where the first material has a greater intrinsic density than the second material, resulting in the density gradient 212 from the tip-end 202 to the root-end 200. For example, the blade 112 may have a root-end material 210 comprising substantially silicon carbide, which has a density of approximately 3.21 g/cm$^3$, and the blade 112 may have a tip-end material 208 comprising a high concentration of silicon (wherein the material at the blade tip comprises at least 50 percent silicon by weight) with an approximate density of 2.33 g/cm$^3$. In this example, the root-end material 210 is denser than the tip end material 208, thereby forming the density gradient 212 in the blade 112.

Figure 3:
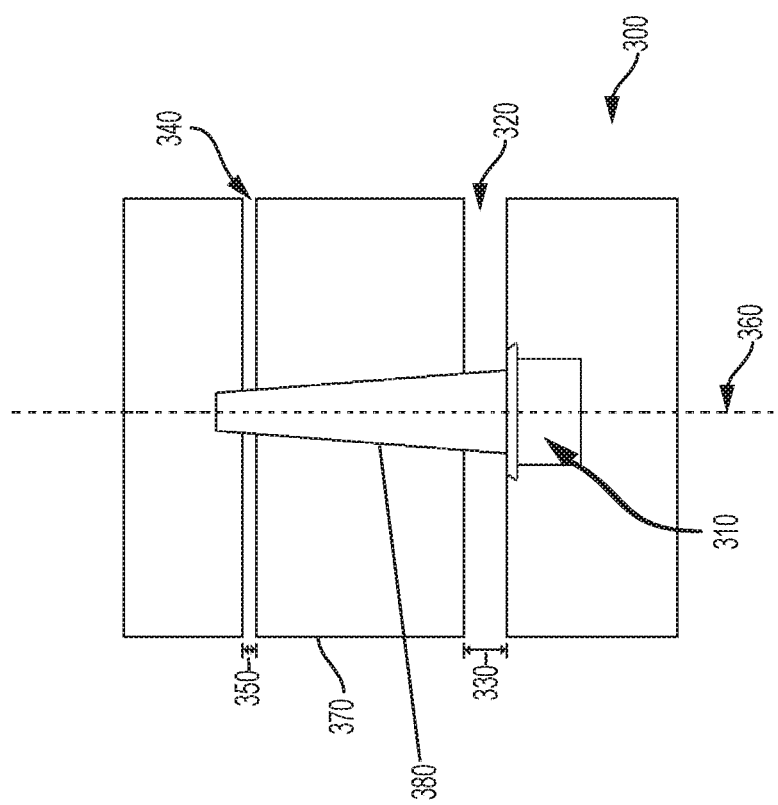
FIG. 3 illustrates the porous fiber preform in an example of a chemical vapor infiltration mask.

FIG. 3 is a cross-sectional view of a porous preform 310 positioned in a first example of a chemical vapor infiltration (CVI) mask 300. The porous preform 310 may include an arrangement of ceramic fibers. The arrangement may be in a desired or target shape. The porous preform 310 may include a three-dimensional weave of the ceramic fibers. Alternatively or in addition, the porous preform 310 may include a two-dimensional weave of the ceramic fibers. Alternatively or in addition, the porous preform 310 may include multiple layers of two-dimensional weave of the ceramic fibers. Alternatively or in addition, the porous preform 310 may include a fiber layup, such as a unidirectional layup. In some examples, the ceramic fibers may be a bundle and/or a tow of fibers. The fibers in each bundle or tow may be braided or otherwise arranged.

The ceramic fibers in the porous preform 310 may comprise a material that is stable at temperatures above 1400 degrees Celsius. Examples of the ceramic fibers may include fibers of alumina, mullite, silicon carbide, zirconia or carbon. The ceramic fibers may not be organic, metallic, or glass fibers.

As explained in detail further below, the CVI mask 300 may help to control an amount of a CVI processing gases that contact the porous preform 310 during CVI. The CVI mask 300 may be composed of graphite and/or other materials capable of maintaining structural stability at temperatures and pressures experienced during the CVI. The CVI mask 300 may be applied to the porous preform directly, or may be positioned within a CVI chamber before loading the porous preform 310 into the CVI chamber.

The CVI mask 300 may take a variety of forms. In the example illustrated in FIG. 3, the CVI mask 300 includes multiple CVI inlets 320, 340, each having a corresponding inlet diameter 330, 350 and a corresponding length. The inlet diameters 330 and 350 may vary so as to correspondingly vary the amount of the CVI processing gases that reach different portions of the porous preform 310. The length of each CVI inlet may run, for example, from an external edge 370 of the CVI mask to an inner edge 380 of the CVI mask 300. In some examples, the CVI mask 300 may have a single pair of CVI inlets located on opposite sides of a center axis 360 of the porous preform 310, such as either of the CVI inlets 320, 340 illustrated in FIG. 3.

The CVI inlets 320, 340 may be spaced at regular intervals along the center axis 360 of the porous preform 310. Alternatively or in addition, the inlet diameters 330, 350 of the CVI inlets 320, 340 may all share a common width, within a 15% variation of each other, for example. Alternatively, the CVI inlet nearest the root-end 200 of the porous preform 310 positioned in the CVI mask 300 is wider than the CVI inlet nearest the tip-end 202.

In some examples, the CVI mask 300 acts a barrier, impermeable to the CVI processing gases, and has no inlets so as to prevent (or limit) the CVI processing gases from coming into contact with a portion of the porous perform 310 that is occluded by the CVI mask 300.

During chemical vapor infiltration (CVI), the CVI mask 300 may help to control the amount of a CVI processing gases that contacts portions of the porous preform 310. In the examples of the CVI mask 300 described above, the CVI mask 300 may allow more of the CVI processing gases to reach a first portion of the porous preform 310 than a second portion. For example, more of the CVI processing gases may reach a portion of the porous preform 310 that will become the root-end 200 of the blade 112 (the first portion) than may reach a portion of the porous preform 310 that will become the tip-end 202 (the second portion).

The CVI processing gases may comprise any matrix material including, for example, CH$_3$SiCl$_3$ (MTS), SiCl$_4$, CH$_4$, BCl$_3$, or any other reactive gas suitable for chemical vapor infiltration. Because the CVI mask 300 may allow more of the CVI processing gases to reach a first portion of the porous preform 310 than a second portion, more of the CVI processing gases may be present in the first portion than the second portion. As a result, the first portion may have a higher density than the second portion. For example, the first portion may have a higher concentration of a carbon than the second portion if the matrix material is silicon carbide.

Figure 4:
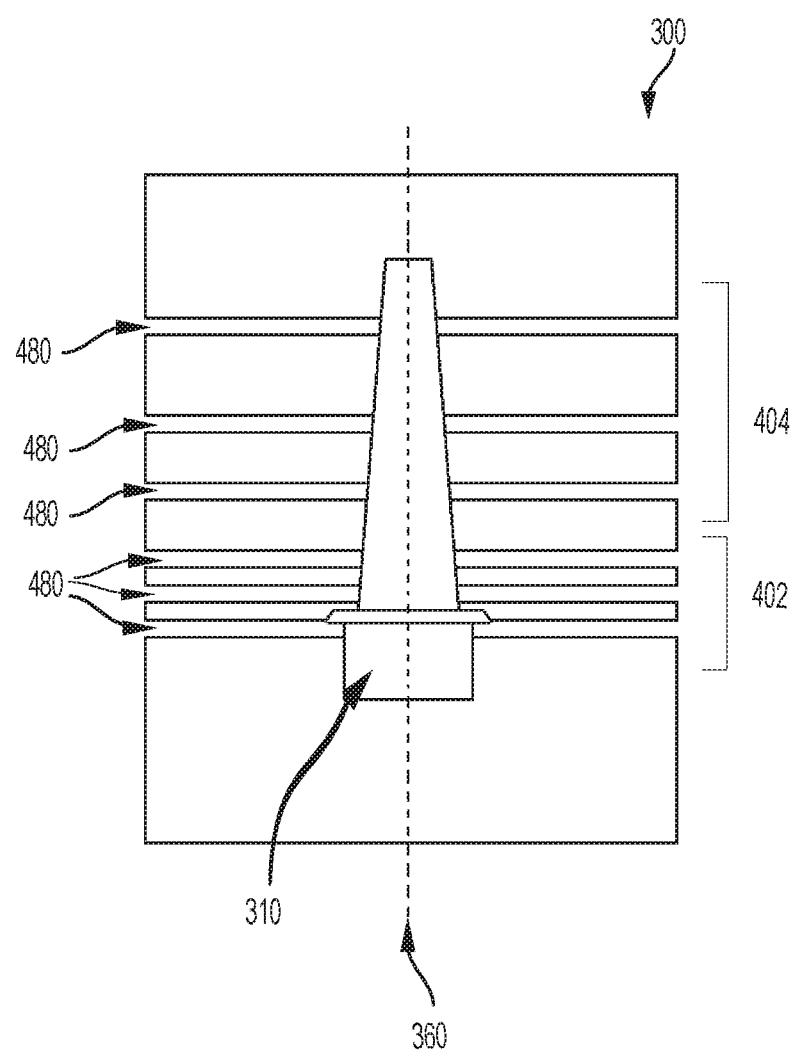
FIG. 4 illustrates the porous fiber preform in an example of a chemical vapor infiltration mask.

FIG. 4 illustrates the porous preform 310 positioned in an example of a CVI mask 300 that includes a plurality of CVI inlets 480. In particular, the CVI mask 300 shown in FIG. 4 has a greater number of CVI inlets 480 leading to a first portion 402 of the porous preform 310 than to a second portion 404 of the porous preform 310. In the illustrated example, the first portion 402 of the porous preform 310 will become the root-end 200 of the blade 112 and the second portion 404 of the porous preform 310 will become the tip-end 202 of the blade 112. In other words, a preform root-end 402 will become the blade root-end 200, and a preform tip-end 404 will become the blade tip-end 202. Each of the CVI inlets 480 may have the same diameter as the other of the CVI inlets 480. That contrasts with the CVI inlets 320, 340 shown in FIG. 3, which have varying diameters. In other examples, the CVI mask 300 may include a combination of one or more of the CVI inlets 320, 340 having varying diameters and one or more of the CVI inlets 320 having a fixed diameter.

Each of the CVI inlets 320, 340, 480 may have any shape or size. Examples of such a shape may include a tube having a constant radius along the length of the inlet, a tube having an elliptical cross section defined by a first radius and a second radius along the length of the inlet, a tube having a cross section defined by a geometric shape, a tube having an irregular cross section, and/or a tube having a cross section that increases and/or decreases in size toward the porous preform 310.

Figure 5:
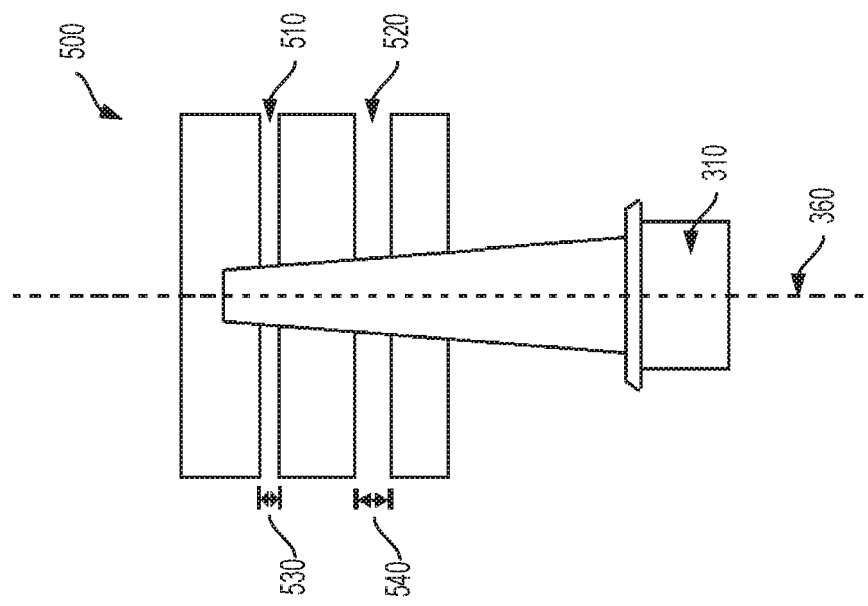
FIG. 5 illustrates the porous fiber preform in an example of a slurry infiltration mask.

FIG. 5 is a cross-sectional view of a slurry infiltration (SI) mask 500. The SI mask 500 helps control the amount of a slurry material that contacts portions of the porous preform 310 during slurry infiltration. In contrast, the CVI mask 300 discussed above helps control the amount of the CVI processing gases that contacts portions of the porous preform 310 during CVI. The SI mask 500 may be composed of graphite and/or other materials capable of maintaining structural stability at temperatures and pressures experienced during the CVI. The SI mask 500 may be applied to the porous preform directly before subjecting the porous preform 310 to slurry infiltration.

As with the CVI mask 300, the SI mask 500 may take a variety of forms. In one example, such as the example illustrated in FIG. 5, the SI mask 500 may include multiple slurry inlets 510, 520, each having a corresponding slurry inlet diameter 530, 540 and a corresponding length. The slurry inlet diameters 530 and 540 may vary so as to correspondingly vary the amount of the slurry material that reaches different portions of the porous preform 310. In some examples, the SI mask 500 may have a single pair of slurry inlets 510 located on opposite sides of a center axis 360 of the porous preform 310, such as either of the SI inlets 510, 520 illustrated in FIG. 5.

The slurry inlets 510, 520 may be spaced at regular intervals along the center axis 360 of the porous preform 310. Alternatively or in addition, the slurry inlet diameters 530, 540 of the slurry inlets 510, 520 may all share a common width, within a 15% variation of each other, for example. Alternatively, in some examples, the slurry inlet 510, 520 that is nearest to the root-end 200 of the porous preform 310 positioned in the SI mask 500 is wider than the slurry inlet 510, 520 that is to the nearest the tip-end 202.

During slurry infiltration (SI), the SI mask 500 may help to control the amount of a slurry material that contacts portions of the porous preform 310. In the examples of the SI mask 500 described above, the SI mask 500 may allow more of the slurry material to reach a first portion of the porous preform 310 than a second portion. For example, more of the SI material may reach a portion of the porous preform 310 that will become the root-end 200 of the blade 112 (the first portion) than may reach a portion of the porous preform 310 that will become the tip-end 202 (the second portion).

The SI material may comprise any matrix material including, for example, silicon carbide, silicon nitride, chromium carbide, alumina, and/or any other reactive material in a liquid medium suitable for slurry infiltration. Because the slurry mask 500 may allow more of the slurry material to reach a first portion of the porous preform 310 than a second portion, more of the slurry material may be present in the first portion than the second portion. As a result, the first portion may have a higher density than the second portion. For example, the first portion may have a higher concentration of a carbon than the second portion if the matrix material is silicon carbide.

Each of the slurry inlets 510, 520 may have the same diameter as the other of the slurry inlets 510, 520. Alternatively, the SI mask 500 may have varying diameters 530, 540. Each of the slurry inlets 510, 520 may have any shape or size. Examples of such a shape may include a tube having a constant radius along the length of the inlet, a tube having an elliptical cross section defined by a first radius and a second radius along the length of the inlet, a tube having a cross section defined by a geometric shape, a tube having an irregular cross section, and/or a tube having a cross section that increases and/or decreases in size toward the porous preform 310.

In an alternative example, the SI mask 500 may be a barrier, impermeable to a slurry material, with no inlets allowing the slurry material to contact the porous perform 310.

In one example, the slurry inlets 510, 520 may be spaced at consistent intervals along the center axis 360 of the preform. In one example, the slurry inlet diameters 530, 540 of the inlets 510, 520 the same width, within 15% variation. In another example, the slurry inlet nearest the root-end 200 when the SI mask is positioned is wider than the slurry inlet nearest the tip-end 202 when the SI mask is positioned. In another example, the density of slurry inlets 510, 520 may be greater at or near the root-end 200 when compared with the density of slurry inlets 510, 520 at or near the tip-end 202. Furthermore, in other example the SI mask 500 may show a combination of such slurry inlet configurations.

Figure 6:
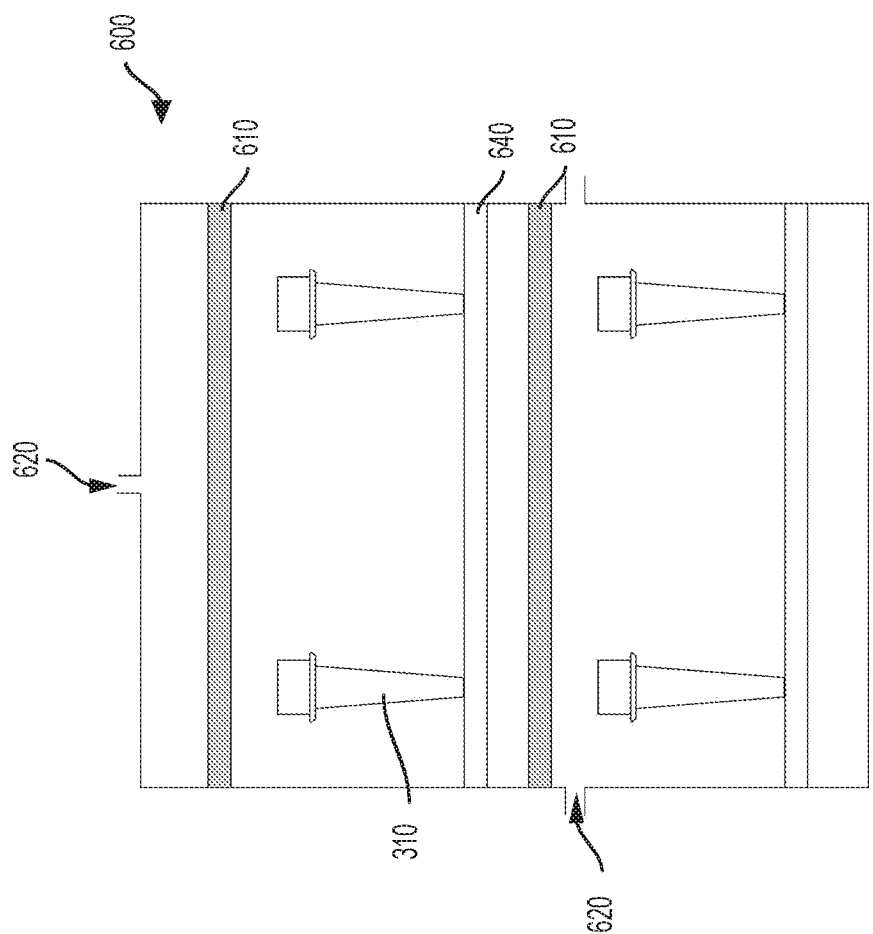
FIG. 6 illustrates a chemical vapor infiltration chamber with heating elements.

A temperature gradient during CVI may aid in creating the density gradient 212. A temperature gradient may be created by directionally heating the porous preform 310 while it undergoes CVI in a chemical vapor infiltration chamber. FIG. 6 illustrates an example of a chemical vapor infiltration chamber 600 with heating elements 610 for forming the blade with the density gradient 212 during CVI. The CVI chamber 600 is configured to receive the porous preform 310 during the CVI process. The CVI chamber 600 has at least one first gas inlet 620 which allows a reactive gas comprising a CVI processing gases to be introduced into the CVI chamber 600. Additionally, the CVI chamber 600 comprises at least one heating element 610. The heating element 610 converts energy into heat through the process of resistive heating, creating a heat source within the CVI chamber 600. The heating element may comprise any number of resistive materials including metal, ceramics, or composites. The CVI chamber 600 may comprise a material that is non-reactive with the reactive gas and resistant to the heightened temperatures created by the heating element 610.

A support plate 640 within the CVI chamber 600 is configured to receive the porous preform 310 (four porous preforms are in the example shown in FIG. 6) such that the tip-end 202 of the porous preform 310 is nearest the support plate 640. For example, the tip-end 202 of the porous preform 310 may rest against the support plate 640. The support plate 640 may be either porous or impermeable to gas. The heating element 610 may be located between the support plate 640 and a first gas inlet 620. Alternatively, the first gas inlet 610 may be located between the heating element 610 and the support plate.

Thus, when the porous preform 310 is positioned on the support plate 640, the first gas inlet 620 and the heating element 610 face a side of the porous preform 310 that is opposite of a side of the porous preform 310 that rests on the support plate 640. Because the root-end 200 of the porous preform 310 is nearer to the heating element 610 than to the tip-end 202, the heating element 610 may heat the root-end 200 to a higher temperature than the tip-end 202, thereby creating a temperature gradient in the porous preform 310. The reactive gas introduced into the CVI chamber 600 may react more quickly at the higher temperature, resulting in a higher density at the root-end 200 than at the tip-end 202.

Alternatively or in addition, partial pressure differences during CVI may help to create the density gradient 212.

When the reactive gas is introduced into the CVI chamber 600 via the first inlet 620, the CVI processing gases entering the CVI chamber 600 will first contact the root-end 200. A portion of CVI processing gases in the reactive gas will infiltrate porous preform 310 near the root-end 200. As the reactive gas diffuses throughout the CVI chamber 600, the CVI processing gases continues to infiltrate the porous preform 310. However, as CVI processing gases infiltrates the preform 310, the partial pressure of the CVI processing gases decreases. This may create a gradient of the partial pressure of the CVI processing gases in the CVI chamber 600 where the partial pressure of the CVI processing gases is greater near the first inlet 620, such as at the root-end 200, compared to the partial pressure of the CVI processing gases near the support plate 640, such as at the tip-end 202. This partial pressure gradient may lead to a greater concentration of CVI processing gases infiltrating the porous preform 310 near the root-end 200 compared the concentration of CVI processing gases infiltrating the porous preform 310 near the tip-end 202, ultimately leading to the density gradient 212 in the completed blade 112.

Additionally, by having the first gas inlet 620 and the heating element 610 face one side of the porous preform 310, the created temperature gradient may amplify the effect of the partial pressure gradient. The CVI processing gases will more readily react with and/or infiltrate the portions of the porous preform that are at an elevated temperature, such as the root-end 200 which is located relatively near the heating element 610. Thus, by heating the porous preform 310 near the first inlet 620 where the partial pressure of the CVI processing gases is greater will lead to a greater concentration of CVI processing gases infiltrating the porous preform 310 near the root-end 200 compared to the concentration of CVI processing gases infiltrating the porous preform 310 near the tip-end 202, ultimately leading to a density gradient in the blade 112.

FIG. 7 is a flowchart illustrating an example of a method of forming the blade 112 with the density gradient 212. The illustrated steps include subjecting the porous preform 310 positioned in the CVI mask 300 to chemical vapor infiltration (CVI) (710), slurry infiltration (SI) (720), and melt infiltration (MI) (730).

During chemical vapor infiltration (CVI) (710), the CVI mask 300 is applied to the porous preform 310. The porous preform 310 in the CVI mask 300 is exposed to a reactive gas that includes the CVI processing gases, allowing a portion of the CVI processing gases to infiltrate the porous preform 310.

Generally, the CVI (710) is performed at elevated temperatures. Additionally, the reactive gas may include the CVI processing gases and an inert carrier gas. CVI (710) takes place in a CVI chamber which is connected to an effluent where the CVI processing gases and, if necessary, the carrier gas, is introduced into the CVI chamber. After CVI (710), the CVI mask 300 is removed from the porous preform 310, and the porous preform then undergoes slurry infiltration (720) without the SI mask 500. Slurry infiltration (720) comprises exposing the porous preform 310 to the slurry material. The slurry material contacts the surface of the porous preform 310 and percolates into the porous preform 310 where the preform 310 maintains a degree of porosity.

After SI (720), the porous preform 310 may then undergo melt infiltration (MI) (730). MI (730), also known as liquid-phase infiltration, comprises exposing the porous preform 310 to a melt material, also referred to as a material in its liquid-phase. This melt material percolates through any pores in the porous preform 310 and either reacts with the porous preform material or deposits onto the porous preform 310. Melt infiltration (730) may be carried out at an elevated temperature to maintain the melt material's liquid phase, although MI may be alternatively carried out without elevating the temperature of the porous preform 310 so long as the melt material is liquid when first exposed to the porous preform 310.

FIG. 8 illustrates a flowchart detailing an example of a method of forming the blade 112 with the density gradient 212. The illustrated steps include subjecting the porous preform 310 to chemical vapor infiltration (CVI) with or without the CVI mask 300 (810), slurry infiltration (SI) with the SI mask 500 (820), and melt infiltration (MI) (730).

In this example, the porous preform 310 is first subjected to CVI (810). In one aspect of the method, the CVI mask 300 may be applied to the porous preform 310 before exposing the preform 310 to the CVI processing gases. In another aspect of the method, the CVI mask 300 is not present when exposing the preform 310 to the CVI processing gases.

After subjecting the porous preform 310 to CVI with or without the CVI mask 300 (810), the porous preform undergoes slurry infiltration (820) with the SI mask 500. For example, the SI mask 500 is applied to the porous preform 310 so that the tip-end 202 of the porous preform is at least partially shielded from contact by the slurry material. As discussed above, the SI mask 500 may or may not have SI inlets. After the SI mask 500 is applied to the porous preform 310, the porous preform 310 and the SI mask 500 are then exposed to the slurry material through SI. The SI mask 500 limits the amount of slurry material that reaches the surface of the porous preform 310. However, if the SI mask 500 comprises slurry inlets 510, 520, the slurry material may contact the porous preform 310 by way of these slurry inlets 510, 520, allowing the slurry material to percolate into the porous preform 310 through the surface of the porous preform exposed within the slurry inlets 510, 520.

After the slurry infiltration (820), the porous preform 310 undergoes melt infiltration (MI) (730), as described above.

FIG. 9 illustrates a flowchart detailing an example of a method of forming the blade 112 with the density gradient 212. The illustrated steps include subjecting the porous preform 310 to chemical vapor infiltration (CVI) (810) with or without the CVI mask 300, subjecting the porous preform 310 to slurry infiltration (SI) (720) with or without the SI mask 500, coating (910) the porous preform in high-char yielding resin, and pyrolyzing (920) the porous preform.

In this example, the porous preform 310 is first subjected to CVI (810) with or without the CVI mask 300. After subjecting the porous preform 310 to CVI (810), the porous preform 310 is subjected to SI (720) with or without the SI mask 500.

After SI (720), a resin mask is positioned on porous preform 310. The resin mask is configured so as to limit the amount of resin that will contact one or more portions of the porous preform 310. The resin mask may comprise any of a variety of materials capable of maintaining structural stability at the pyrolysis temperature. The resin mask may take a variety of forms. In one example, the resin mask may be a barrier, impermeable to the resin, having no inlets allowing the resin to contact the porous perform 310, but only occluding a portion of porous preform 310. In another example, the resin mask may have a plurality of resin inlets each having a corresponding inlet diameter and a corresponding length. The length of the resin inlet runs from the external edge of the resin mask along the resin inlet until the inner edge of the resin mask.

In one example, the resin inlet diameters of the inlets are the same width, within 15% variation. In another example, the resin inlet nearest the root-end 200 when the resin mask is positioned is wider than the resin inlet nearest the tip-end 202 when the resin mask is positioned on the porous preform 310.

In some examples of the method, the resin mask may comprise a plurality of resin inlets. In one example, the density of resin inlets may be greater at or near the root-end 200 when compared with the density of resin inlets at or near the tip-end 202. Furthermore, in other examples the resin mask may show a combination of such resin inlet configurations. Each of the resin inlets may have any shape or size. Examples of such a shape may include a tube having a constant radius along the length of the inlet, a tube having an elliptical cross section defined by a first radius and a second radius along the length of the inlet, a tube having a cross section defined by a geometric shape, a tube having an irregular cross section, and/or a tube having a cross section that increases and/or decreases in size toward the porous preform 310. In other words, the resin mask make take on any suitable shape like the SI mask 500 and the CVI mask 300 described above.

In one aspect, the resin mask may be impervious to the resin material without any inlets. In another aspect, the resin mask may have one or more inlets, allowing resin to contact a portion of the porous preform 310 in a predetermined location while limiting the amount of resin that will contact the porous preform 310 for the areas that are in direct contact with the resin mask. After the porous preform 310 is fitted with the resin mask, the porous preform 310 and resin mask are exposed (910) to the resin material, namely, a high-char yielding resin.

The high-char yielding resin may be any material comprising an organic compound, or mixture of organic compounds, that when exposed to elevated temperature decomposes into carbon or carbonaceous material and other products. Generally, char-yield is measured as a percent of solid amount of material obtained at end of pyrolysis. Examples of high-char yielding resins include boron-containing phenolic resins and phosphorous containing epoxy resins, among others. Alternatively or in addition, high-char yielding resins may include copolymers of homopolymers or a mixture of polymers.

After exposing (910) the porous preform to the high-char yielding resin 910, the porous preform 310 is then pyrolized (920), meaning the porous preform 310 is exposed to a temperature high enough to pyrolyze the high-char yielding resin. The temperature needed to pyrolyze the material will be specific to the resin or resins used. By pyrolyzing the resin, a carbon gradient is created in the porous preform 310. The carbon from the pyrolyzed resin may react with any silicon that may be present in or on the porous preform 310 to create areas of silicon carbide, leading to a silicon carbide gradient. For example, after pyrolysis, the blade 112 may have a root-end material 210 comprising substantially silicon carbide, which has a density of approximately 3.21 g/cm$^3$, and the blade 112 may have a tip-end material 208 comprising substantially silicon having an approximate density of 2.33 g/cm$^3$. After pyrolysis (920), the porous preform 310 may then undergo melt infiltration (MI) (730), as described above.

The methods illustrated in the flowcharts may include additional, different, or fewer operations than illustrated. For example, the steps may include finishing the blade 112 by machining one or more surfaces. As another example, the steps may include applying an environmental coating to the blade 112. Each illustrated component may include additional, different, or fewer components. For example, the CVI mask 310 and/or the SI mask 500 may include additional, different, or fewer inlets. The inlets to the CVI mask 310 and/or the SI mask 500 may be located in additional, different, or fewer locations than illustrated. The CVI mask 310 and/or the SI mask 500 may cover additional, different, or fewer portions of the porous preform than illustrated.

To clarify the use of and to hereby provide notice to the public, the phrases "at least one of <A>, <B>, . . . and <N>" or "at least one of <A>, <B>, . . . , <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed. Unless otherwise indicated or the context suggests otherwise, as used herein, "a" or "an" means "at least one" or "one or more."

While various embodiments have been described, it will be apparent to those of ordinary skill in the art that many more embodiments and implementations are possible. Accordingly, the embodiments described herein are examples, not the only possible embodiments and implementations.

The subject-matter of the disclosure may also relate, among others, to the following aspects:

1. An aspect comprising:
    reducing potential stress of a centrifugal load on a blade for a gas turbine engine by manufacturing a density gradient in the blade, wherein the density gradient includes a change in density between a blade root-end of the blade and a blade tip-end of the blade.
2. The method of aspect 1, wherein manufacturing the density gradient comprises varying a percentage of silicon carbide in the blade along a radial direction, wherein the radial direction is in a direction away from a point around which the blade is configured to rotate.
3. The method of aspect 1 wherein manufacturing the density gradient comprises:
    providing a porous preform comprising a preform root-end and a preform tip-end;
    infiltrating the porous preform with a chemical vapor matrix material;
    infiltrating the porous preform with a ceramic-containing slurry; and
    infiltrating the porous preform with a ceramic-containing melt material.
4. The method of aspect 3 wherein infiltrating with the chemical vapor matrix material comprises exposing the chemical vapor matrix material to the preform root-end at a first partial pressure that is greater than a second partial pressure of the chemical vapor matrix material applied to the preform tip-end.
5. The method of aspect 4 further comprising arranging the porous preform within a chemical vapor infiltration mask having a plurality of chemical vapor inlets including a first inlet and a second inlet, wherein the first inlet is larger than the second inlet, wherein the first inlet is located closer to the preform root-end of the porous preform than to the tip-end, wherein the second inlet is located closer to the preform tip-end than to the preform root-end.

6. The method of aspect 4 wherein infiltrating with the chemical vapor matrix material comprises heating the preform root-end to create a temperature differential between the preform root-end and the preform tip-end.

7. The method of aspects 5 or 6 wherein infiltrating the porous preform with a ceramic-containing slurry material comprises exposing the preform root-end in a first amount of ceramic-containing slurry that is greater than a second amount of ceramic-containing slurry applied to the preform tip-end; and 8. The method of aspect 7 further comprising applying a slurry infiltration mask to a portion of the tip-end of the porous preform before infiltrating the porous preform with the ceramic-containing slurry, and removing the slurry infiltration mask from the porous preform.

9. The method of aspect 8 wherein the slurry infiltration mask comprises a plurality of slurry inlets.

10. The method of aspect 2 wherein manufacturing the density gradient comprises:
providing a porous preform comprising a preform root-end and a preform tip-end;
infiltrating the porous preform with a chemical vapor matrix material;
infiltrating the porous preform with a ceramic-containing slurry material;
applying a high-char yielding resin to the tip-end of the porous preform in a first amount that is greater than a second amount of the high-char yielding resin applied to the preform root-end of the porous preform;
infiltrating the porous preform with a ceramic-containing melt material; and
pyrolyzing the high-char yield resin.

11. The method of aspect 10 further comprising infiltrating the porous preform with a melt material.

12. The method of aspect 1 wherein manufacturing the density gradient comprises:
providing a preform comprising a preform root-end and a preform tip-end;
infiltrating the porous preform with a chemical vapor infiltration processing gas comprising at least one metal;
infiltrating the porous preform with a metal-containing slurry; and
infiltrating the porous preform with a metal-containing melt material.

13. The method of aspect 1 wherein manufacturing the density gradient comprises:
providing a porous preform comprising a preform root-end and a preform tip-end;
infiltrating the porous preform with a chemical vapor infiltration processing gas; and
infiltrating the porous preform with a ceramic-oxide containing slurry.

14. A method of manufacturing a blade for a gas turbine engine with a density gradient between a blade root-end of the blade and a blade tip-end of the blade, the method comprising:
providing a porous preform comprising a preform root-end and a preform tip-end;
infiltrating the porous preform with a chemical vapor infiltration processing gas;
applying a slurry infiltration mask to a portion of the tip-end of the porous preform
infiltrating the porous preform with a ceramic-containing slurry; and
removing the slurry infiltration mask from the porous preform.

15. The method of aspect 14 wherein the slurry infiltration mask comprises a plurality of slurry inlets.

16. A blade for a gas turbine engine comprising a blade root-end and a blade tip-end, wherein the blade has a density gradient, wherein the density gradient includes a change in density between a blade root-end of the blade and a tip-end of the blade.

17. The blade of aspect 6 wherein the blade is a compressor blade.

18. The blade of aspect 6 wherein the blade is a turbine blade.

19. The blade of aspects 17 or 18 wherein the blade is contiguous along a longitudinal axis of the blade and further comprises a blade root-end chemical composition and a blade tip-end chemical composition wherein the blade root-end composition transitions into the blade tip-end composition.

What is claimed is:

1. A method comprising:
reducing potential stress of a centrifugal load on a blade for a gas turbine engine by manufacturing a density gradient in a ceramic matrix composite of the blade by infiltrating a porous fiber preform, wherein the density gradient includes a change in density between a blade root-end of the blade and a blade tip-end of the blade.

2. The method of claim 1, wherein manufacturing the density gradient comprises varying a percentage of silicon carbide in the blade along a radial direction, wherein the radial direction is in a direction away from a point around which the blade is configured to rotate.

3. The method of claim 1 wherein manufacturing the density gradient comprises:
providing the porous fiber preform, the porous fiber preform comprising a preform root-end and a preform tip-end;
infiltrating the porous fiber preform with a chemical vapor matrix material;
infiltrating the porous fiber preform with a ceramic-containing slurry; and
infiltrating the porous fiber preform with a ceramic-containing melt material.

4. The method of claim 3 wherein infiltrating with the chemical vapor matrix material comprises exposing the chemical vapor matrix material to the preform root-end at a first partial pressure that is greater than a second partial pressure of the chemical vapor matrix material applied to the preform tip-end.

5. The method of claim 4 further comprising arranging the porous fiber preform within a chemical vapor infiltration mask having a plurality of chemical vapor inlets including a first inlet and a second inlet, wherein the first inlet is larger than the second inlet, wherein the first inlet is located closer to the preform root-end of the porous fiber preform than to the tip-end, wherein the second inlet is located closer to the preform tip-end than to the preform root-end.

6. The method of claim 4 wherein infiltrating with the chemical vapor matrix material comprises heating the preform root-end to create a temperature differential between the preform root-end and the preform tip-end.

7. The method of claim 5 wherein infiltrating the porous fiber preform with a ceramic-containing slurry material comprises exposing the preform root-end in a first amount of ceramic-containing slurry that is greater than a second amount of ceramic-containing slurry applied to the preform tip-end.

8. The method of claim 7 further comprising applying a slurry infiltration mask to a portion of the tip-end of the porous fiber preform before infiltrating the porous fiber preform with the ceramic-containing slurry, and removing the slurry infiltration mask from the porous fiber preform.

9. The method of claim 8 wherein the slurry infiltration mask comprises a plurality of slurry inlets.

10. The method of claim 2 wherein manufacturing the density gradient comprises:
   providing the porous fiber preform, the porous fiber preform comprising a preform root-end and a preform tip-end;
   infiltrating the porous fiber preform with a chemical vapor matrix material;
   infiltrating the porous fiber preform with a ceramic-containing slurry material;
   applying a high-char yielding resin to the tip-end of the porous fiber preform in a first amount that is greater than a second amount of the high-char yielding resin applied to the preform root-end of the porous fiber preform;
   pyrolyzing the high-char yielding resin by which a silicon carbon gradient is formed; and
   forming the density gradient in the ceramic matric composite by infiltrating the porous fiber preform with a ceramic-containing melt material, which forms a silicon carbide gradient.

11. The method of claim 10 further comprising infiltrating the porous fiber preform with a ceramic-containing melt material.

12. The method of claim 1 wherein manufacturing the density gradient comprises:
   providing the porous fiber preform, the porous fiber preform comprising a preform root-end and a preform tip-end;
   infiltrating the porous fiber preform with a chemical vapor matrix material comprising at least one metal;
   infiltrating the porous fiber preform with a metal-containing slurry; and
   infiltrating the porous fiber preform with a metal-containing melt material.

13. The method of claim 1 wherein manufacturing the density gradient comprises:
   providing the porous fiber preform, the porous fiber preform comprising a preform root-end and a preform tip-end;
   infiltrating the porous fiber preform with a chemical vapor matrix material; and
   infiltrating the porous fiber preform with a ceramic-oxide containing slurry.

14. A method of manufacturing a blade for a gas turbine engine with a density gradient between a blade root-end of the blade and a blade tip-end of the blade, the method comprising:
   providing a porous preform comprising a preform root-end and a preform tip-end;
   infiltrating the porous preform with a chemical vapor matrix material;
   applying a slurry infiltration mask to a portion of the tip-end of the porous preform infiltrating the porous preform with a ceramic-containing slurry; and
   removing the slurry infiltration mask from the porous preform.

15. The method of claim 14 wherein the slurry infiltration mask comprises a plurality of slurry inlets.

16. An apparatus comprising:
   a blade for a gas turbine engine comprising a blade root-end and a blade tip-end, wherein a ceramic matrix composite of the blade has a density gradient, wherein the density gradient includes a change in density between a blade root-end of the blade and a tip-end of the blade, wherein a rate of change in density is constant along the density gradient.

17. The apparatus of claim 16 wherein the blade is a compressor blade.

18. The apparatus of claim 16 wherein the blade is a turbine blade.

19. The apparatus of claim 16 wherein the blade is contiguous along a longitudinal axis of the blade and further comprises a blade root-end chemical composition and a blade tip-end chemical composition wherein the blade root-end composition transitions into the blade tip-end composition.

* * * * *